United States Patent
Funatsuki et al.

(10) Patent No.: US 8,830,760 B2
(45) Date of Patent: Sep. 9, 2014

(54) SEMICONDUCTOR STORAGE DEVICE

(71) Applicant: Kabushiki Kaisha Toshiba, Tokyo (JP)

(72) Inventors: Rieko Funatsuki, Kamakura (JP);
Osamu Nagao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/771,328

(22) Filed: Feb. 20, 2013

(65) Prior Publication Data

US 2014/0050028 A1 Feb. 20, 2014

Related U.S. Application Data (60) Provisional application No. 61/683,815, filed on Aug. 16, 2012.

(51) Int. Cl.
*G11C 16/06* (2006.01)
*G11C 16/34* (2006.01)
*G11C 16/28* (2006.01)
*G11C 7/14* (2006.01)

(52) U.S. Cl.
CPC ............ *G11C 16/3459* (2013.01); *G11C 16/28* (2013.01); *G11C 7/14* (2013.01)
USPC ............. 365/185.21; 365/185.22; 365/185.25

(58) Field of Classification Search
CPC ...... G11C 16/3459; G11C 16/28; G11C 7/14; G11C 11/4091
USPC ............. 365/185.21, 185.22, 185.25, 185.17, 365/189.05, 207, 210.1, 210.11
See application file for complete search history.

(56) References Cited

U.S. PATENT DOCUMENTS

| | | | |
|---|---|---|---|
| 6,356,485 B1 * | 3/2002 | Proebsting | 365/189.16 |
| 6,643,188 B2 | 11/2003 | Tanaka et al. | |
| 6,990,019 B2 | 1/2006 | Tanaka et al. | |
| 7,088,616 B2 | 8/2006 | Tanaka et al. | |
| 7,145,806 B2 * | 12/2006 | Kawai | 365/185.25 |
| 7,224,615 B2 | 5/2007 | Tanaka | |
| 7,286,404 B2 | 10/2007 | Tanaka et al. | |
| 7,301,806 B2 | 11/2007 | Tanaka | |
| 7,405,970 B2 | 7/2008 | Tanaka et al. | |

(Continued)

FOREIGN PATENT DOCUMENTS

| | | |
|---|---|---|
| JP | 2003-196988 | 7/2003 |
| JP | 2008-269736 | 11/2008 |

(Continued)

*Primary Examiner* — Gene Auduong
(74) *Attorney, Agent, or Firm* — Oblon, Spivak, McClelland, Maier & Neustadt, L.L.P.

(57) ABSTRACT

A memory includes memory cells and a sense amplifier including a sense node that transmits a voltage according to a current flowing in one of the memory cells and detects logic of data based on the voltage of the sense node. A write sequence of writing data in a selected cell is performed by repeating write loops each including a write stage of writing data in the selected cell and a verify read stage of verifying that the data has been written in the selected cell by performing discharge from the sense node through the selected cell. The sense amplifier changes, according to a logic of data detected at the verify read stage in a first write loop, a period of discharge from the sense node to the selected cell at the verify read stage in a second write loop following the first write loop.

18 Claims, 7 Drawing Sheets

(56) References Cited

U.S. PATENT DOCUMENTS

| | | |
|---|---|---|
| 7,468,908 B2 | 12/2008 | Tanaka |
| 7,616,502 B2 | 11/2009 | Iwai |
| 7,672,168 B2 | 3/2010 | Tanaka et al. |
| 7,864,591 B2 | 1/2011 | Tanaka et al. |
| 8,009,470 B2 * | 8/2011 | Iwai et al. ............ 365/185.03 |
| 8,203,888 B2 | 6/2012 | Fukuda et al. |
| 8,208,311 B2 | 6/2012 | Tanaka et al. |
| 8,223,543 B2 * | 7/2012 | Iwai et al. ............ 365/185.03 |
| 8,559,226 B2 * | 10/2013 | Abe et al. ............ 365/185.17 |
| 2003/0147278 A1 | 8/2003 | Tanaka et al. |
| 2004/0047183 A1 | 3/2004 | Tanaka et al. |
| 2004/0066680 A1 | 4/2004 | Tanaka et al. |
| 2005/0024944 A1 | 2/2005 | Tanaka |
| 2005/0135154 A1 | 6/2005 | Tanaka et al. |
| 2006/0120158 A1 | 6/2006 | Tanaka |
| 2006/0203558 A1 | 9/2006 | Tanaka et al. |
| 2008/0043530 A1 | 2/2008 | Tanaka et al. |
| 2008/0068893 A1 | 3/2008 | Tanaka |
| 2008/0266967 A1 | 10/2008 | Iwai |
| 2008/0298129 A1 | 12/2008 | Tanaka et al. |
| 2010/0118607 A1 | 5/2010 | Tanaka et al. |
| 2010/0135078 A1 | 6/2010 | Iwai et al. |
| 2011/0075485 A1 | 3/2011 | Fukuda et al. |
| 2011/0090741 A1 | 4/2011 | Tanaka et al. |
| 2011/0286268 A1 | 11/2011 | Iwai et al. |
| 2011/0305089 A1 | 12/2011 | Abe et al. |
| 2012/0236657 A1 | 9/2012 | Tanaka et al. |
| 2012/0243327 A1 | 9/2012 | Iwai et al. |

FOREIGN PATENT DOCUMENTS

| | | |
|---|---|---|
| JP | 2010-134984 | 6/2010 |
| JP | 2011-70725 | 4/2011 |
| JP | 2011-258289 | 12/2011 |

* cited by examiner

SEMICONDUCTOR STORAGE DEVICE

CROSS REFERENCE TO RELATED APPLICATIONS

This application is based upon and claims the benefit of priority from the prior U.S. Patent Application No. 61/683,815 filed on Aug. 16, 2012, the entire contents of which are incorporated herein by reference.

FIELD

The embodiments of the present invention relate to a semiconductor storage device.

BACKGROUND

QPW (Quick Pass Write) is proposed to reduce a threshold distribution width of memory cells after data write in a nonvolatile memory such as a NAND flash memory. The QPW is a technique that enables to write data under write conditions according to threshold voltages of memory cells in each of write loops in one data write sequence. In the conventional QPW, data of memory cells need to be read plural times while changing word line voltages at the time of verify read in each write loop. Accordingly, set-up time for charging word lines with a predetermined voltage has been required in each of plural read operations.

To reduce the set-up time for word lines, a method of detecting data both of during discharge of sense nodes and after the discharge is proposed. Discharge rates of a sense node vary according to threshold voltages of a corresponding memory cell. Therefore, if data is detected both of during discharge of each sense node and after the discharge, the threshold voltage of a corresponding memory cell can be detected at plural levels without changing a word line voltage.

However, the voltage of each sense node continuously changes during discharge of the sense node and thus a conduction state of a corresponding sense transistor may switch while a corresponding latch circuit is capturing data. In such a case, a corresponding sense amplifier cannot correctly detect data during verify read. When a data capture period by the latch circuit (a conduction period of the sense transistor) is reduced, there is a possibility that data is not correctly transferred to the latch circuit.

DETAILED DESCRIPTION

A semiconductor storage device according to an embodiment includes a plurality of memory cells and a sense amplifier including a sense node that transmits a voltage according to a current flowing in a corresponding one of the memory cells and configured to detect logic of data based on the voltage of the sense node. A write sequence of writing data in a selected memory cell among the memory cells is performed by repeating write loops each including a write stage of writing data in the selected memory cell and a verify read stage of verifying that the data has been written in the selected memory cell by performing discharge from the sense node through the selected memory cell. The sense amplifier changes, according to a logic of data detected at the verify read stage in a first write loop among the write loops, a period of discharge from the sense node to the selected memory cell at the verify read stage in a second write loop following the first write loop.

A semiconductor storage device according to another embodiment includes a plurality of memory cells and a sense amplifier including a sense node that transmits a voltage according to a current flowing in a corresponding one of the memory cells and configured to detect logic of data based on the voltage of the sense node. A write sequence of writing data in a selected memory cell among the memory cells is performed by repeating write loops each including a write stage of writing data in the selected memory cell and a verify read stage of verifying that the data has been written in the selected memory cell by performing discharge from the sense node through the selected memory cell. The sense amplifier changes, according to a logic of data detected at the verify read stage in a first write loop among the write loops, initial voltage of the sense node before discharge from the sense node at the verify read stage in a second write loop following the first write loop.

Embodiments will now be explained with reference to the accompanying drawings. The present invention is not limited to the embodiments.

First Embodiment

Figure 1:
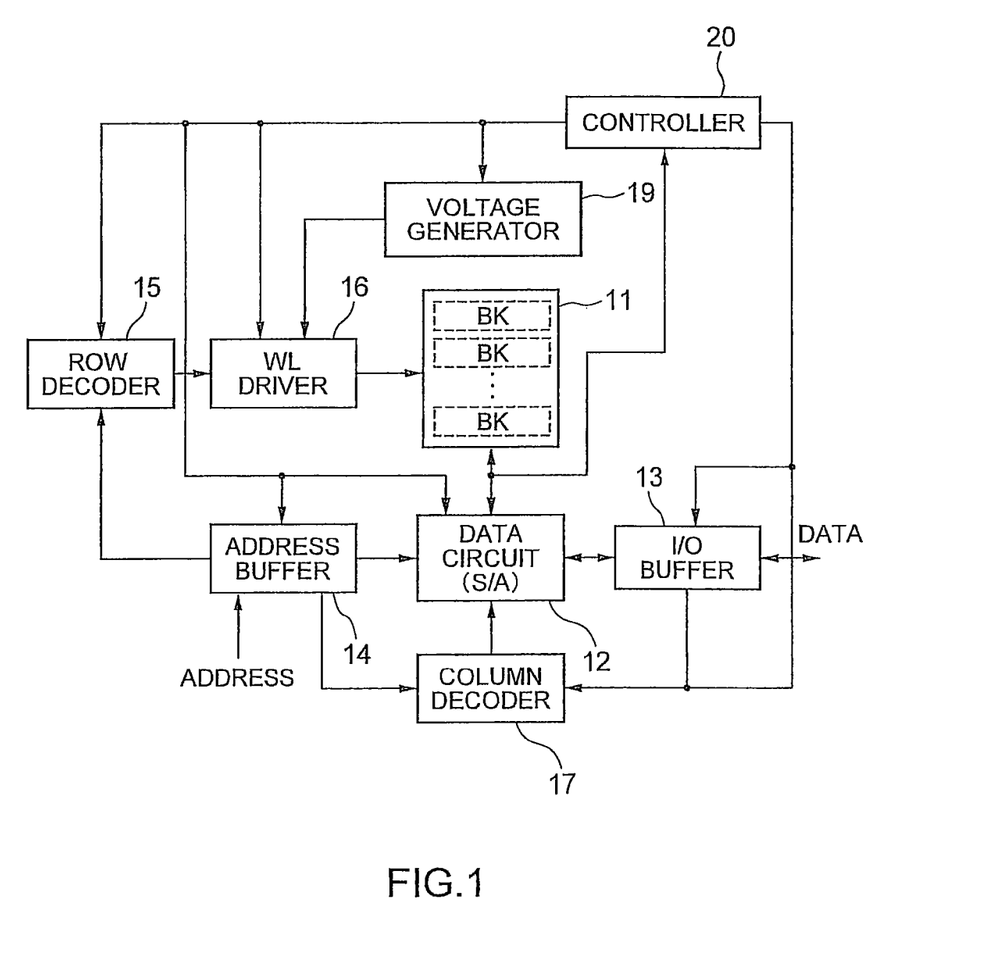
FIG. 1 shows a configuration of a NAND flash memory according to a first embodiment.

FIG. 1 shows a configuration of a NAND flash memory according to a first embodiment. The NAND flash memory (hereinafter, also simply as "memory") includes a memory cell array 11, a data circuit (a sense amplifier circuit) 12, an I/O buffer 13, an address buffer 14, a row decoder 15, a word line driver 16, a column decoder 17, a voltage generator 19, and a controller 20.

Figure 2:
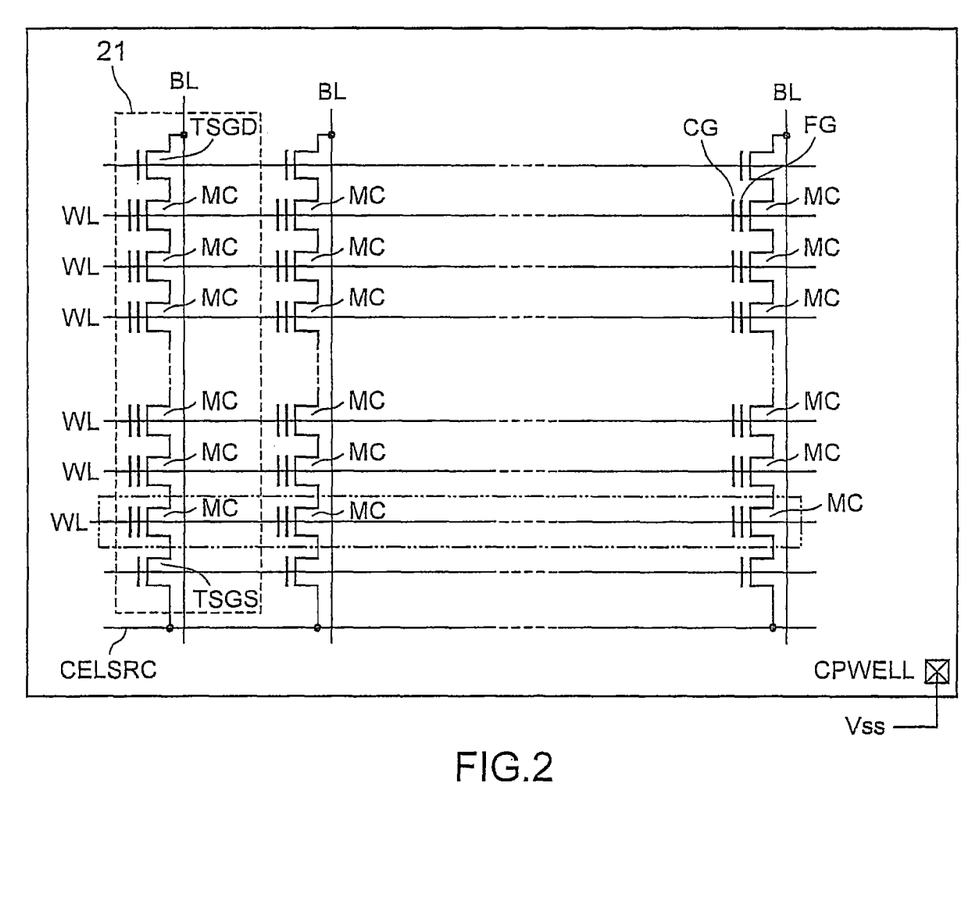
FIG. 2 is a circuit diagram showing a configuration of a memory cell array.

FIG. 2 is a circuit diagram showing a configuration of a memory cell array. The memory cell array 11 includes a plurality of memory cells MC arranged two-dimensionally in a matrix. A gate of each memory cell MC is connected to a word line WL, and a source or drain of each memory cell MC is connected to a bit line BL. A plurality of word lines WL and a plurality of bit lines BL are arranged to intersect each other. Memory cells MC connected in series form a NAND string 21. One end of each NAND string 21 is connected to a bit line BL via a select transistor TSGD and the other end thereof is connected to a source CELSRC via a select transistor TSGS. The memory cell array 11 is divided into memory blocks BK each serving as a data erase unit as shown in FIG. 1.

As shown in FIG. 1, the data circuit (a sense amplifier S/A) 12 and the column decoder 17 are arranged on one end of the memory cell array 11 in a bit line direction. The column decoder 17 selects one of the bit lines BL according to a column address signal. A corresponding one of the sense amplifiers S/A detects a logic of data based on a current flowing in a corresponding memory cell MC via the selected bit line BL. This enables the sense amplifier S/A to detect data stored in the memory cells MC. The data circuit 12 includes a plurality of sense amplifiers S/A corresponding to the bit lines BL, respectively.

The row decoder 15 and the word line driver 16 are arranged on both ends of the memory cell array 11 in a word line direction. The row decoder 15 selects one of the memory blocks BK and one of the word lines WL in the selected memory block BK according to a block address signal and a row address signal. The word line driver 16 is connected to the word lines WL and applies a voltage to the selected word line WL when data is to be written in memory cells MC or when data is to be read from memory cells MC.

The address buffer 14 temporarily stores therein addresses such as a block address, a row address, and a column address.

The voltage generator 19 is provided to generate an internal voltage required for each operation (a voltage obtained by boosting a power-supply voltage, for example). The voltage generator 19 generates a voltage to be applied to the selected word line during data write or data read, for example.

The I/O buffer 13 is provided to enable the data circuit 12 to communicate data with outside.

The controller 20 receives various types of external control signals and controls operations of the data circuit 12, the I/O buffer 13, the address buffer 14, the row decoder 15, the word line driver 16, the column decoder 17, and the voltage generator 19 according to the control signals. The controller 20 performs sequence controls of data read, data write, and erase according to an external control signal and a command.

A basic operation of the NAND flash memory and an operation of the NAND flash memory according to the first embodiment are explained below.

FIGS. 3A to 3D are graphs representing a basic data write operation (a program operation) with transition of threshold voltage distributions of memory cells. Threshold voltages of memory cells are plotted on the abscissa of the graphs. The numbers of memory cells are plotted on the ordinate of the graphs. FIGS. 3A to 3D show a write sequence of writing data in selected memory cells MC of each column connected to a selected word line.

Figure 3A:
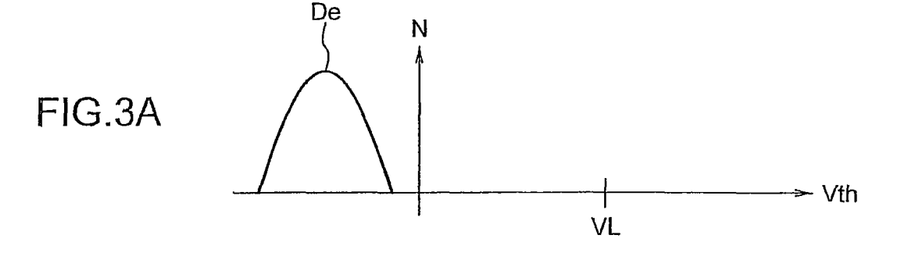
FIGS. 3A to 3D are graphs representing a basic data write operation with transition of threshold voltage distributions of memory cells.

FIG. 3A shows a distribution De in an erase state, in which all the memory cells MC are in erase states. Each of memory cells MC in the NAND flash memory includes a floating gate FG and a control gate CG as shown in FIG. 2. The control gate CG is connected to a corresponding one of the word lines WL. And, the word line driver 16 applies a voltage to the control gate CG via the word line WL. Accordingly, a threshold voltage of a memory cell MC is changed by injecting charge (for example, electrons) to the floating gate FG or pulling charge off the floating gate FG. For example, when all memory cells MC are formed of an N-FET (Field-Effect Transistor), the threshold voltage of each memory cell MC is increased by injecting electrons to the floating gate FG. On the other hand, the threshold voltage is reduced by pulling electrons off the floating gate FG. A state of a memory cell MC having a high threshold voltage is indicated by data "0" and a state of a memory cell MC having a low threshold voltage is indicated by data "1". That is, the erase state shown in FIG. 3A shows the data "1" is written in the memory cells MC and FIGS. 3A to 3D show an operation of writing the data "0" in any of memory cells MC (hereinafter, also "1" cells) having the data "1" stored therein.

The write sequence of writing data in selected memory cells MC is performed by repeating a plurality of write loops. Each of the write loops includes a write stage of writing data in selected memory cells MC and a verify read stage of verifying whether or not the data has been written in the selected memory cells MC by performing discharge from the corresponding sense nodes SEN through the selected memory cells MC flowing a cell current. For example, FIGS. 3B to 3D each shows a threshold voltage distribution obtained after a write loop is performed.

Figure 3B:
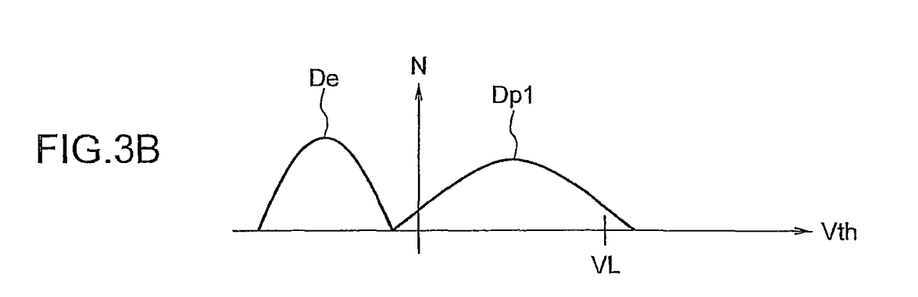

FIG. 3B shows a threshold voltage distribution Dp1 of the memory cells MC, after a first write loop is performed. At the write stage, a high-level voltage (VPGM) is applied to a word line WL connected to selected memory cells MC and the bit lines BL are set to a low-level voltage (VSS). The select transistors TSGD are then brought into a conductive state, thereby setting a channel part of each selected memory cell MC to the low-level voltage (VSS). Accordingly, a high electric field is applied between the control gate CG and the channel part and electrons are injected to the floating gate FG, so that data is written in the selected memory cells MC.

The verify read stage is performed after the write stage is performed. In FIGS. 3A to 3D, VL denotes a verify level. When a threshold voltage of a selected memory cell MC has reached the verify level VL, it is determined that the selected memory cell MC has passed verify read. That is, it is considered that data has been written in the selected memory cell MC. NAND strings including selected memory cells MC that have passed the verify read are disconnected from the bit lines BL and the sources S by the select transistors TSGD and TSGS in subsequent write loops. Accordingly, the channel parts of the selected memory cells MC become an electrically-floating state and thus no write operation is performed to the selected memory cells MC having passed the verify read in the subsequent write loops.

On the other hand, when a threshold voltage of a selected memory cell MC is lower than the verify level VL, it is determined that the selected memory cell MC has failed the verify read. In this case, it is considered that data has not been written yet in the selected memory cell MC. Therefore, a write operation is further performed to the selected memory cell MC in the next write loop.

Figure 3C:
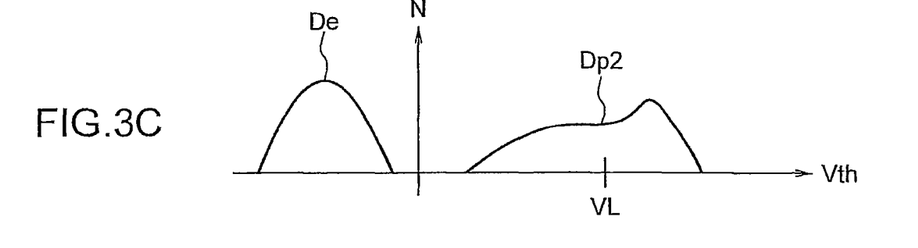

FIG. 3C shows a threshold voltage distribution Dp2 of the memory cells MC, after a second write loop is performed. Also in the second and subsequent write loops, a high-level voltage (VPGM) is applied to the word line WL connected to the selected memory cells MC and the bit lines BL are set to the low-level voltage (VSS) at the write stage. When a threshold voltage of a selected memory cell MC has reached the verify level VL in the second write loop, it is determined that the selected memory cell MC has passed the verify read. No write operation is performed to selected memory cells MC having passed the verify read in subsequent write loops.

On the other hand, when a threshold voltage of a selected memory cell MC is lower than the verify level VL, it is determined that the selected memory cell MC has failed the verify read. In this case, a write operation is further performed to the selected memory cell MC in the next write loop.

Figure 3D:
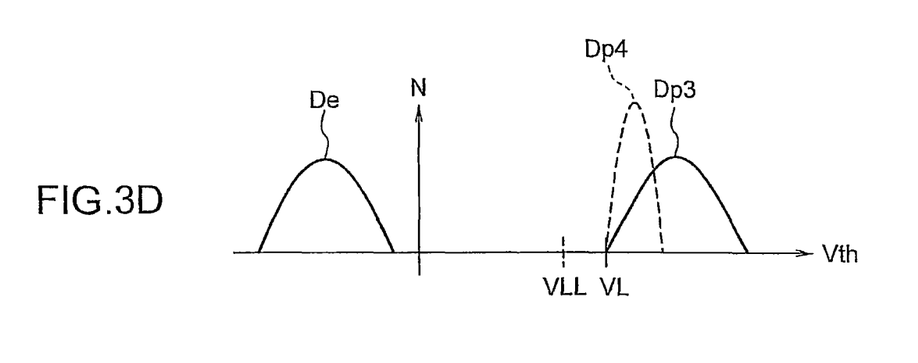

FIG. 3D shows a threshold voltage distribution Dp3 of the memory cells MC after an n-th (n is an integer) write loop is performed. After the n-th write, threshold voltages of all the selected memory cells MC have reached the verify level VL. Therefore, the write sequence ends at that time.

In this way, by repeatedly performing the write loops in one write sequence, the threshold voltages of the selected memory cells MC are shifted little by little. In the next write loop, a write operation is further performed only to memory cells MC having threshold voltages that have not reached the verify level VL, while no write operation is performed to memory cells MC having threshold voltages that have reached the verify level VL. This enables to narrow a threshold distribution of the selected memory cells MC after the end of the write sequence.

The QPW is used to further narrow the width of the threshold distribution Dp3 without prolonging the write sequence. In the QPW, voltage levels of the bit lines BL are changed according to the threshold voltage levels of the selected memory cells MC. For example, as shown in FIG. 3D, verify read is performed at the verify read stage in each write loop by using two levels of the word line voltage including the verify level VL and a verify low level VLL lower than the verify level VL.

When a threshold voltage of a memory cell MC is lower than the verify low level VLL, it can be determined that the threshold voltage of the selected memory cell MC is quite lower than the original verify level VL. Therefore, in the next write loop, a voltage level of the corresponding bit line BL is set to the low-level voltage (VSS). That is, the memory sets a shift width of the threshold voltage of the selected memory cell MC to be relatively large, thereby writing data in the selected memory cell MC relatively strongly.

When a threshold voltage of a selected memory cell MC is equal to or higher than the verify low level VLL but lower than the verify level VL, it can be determined that the threshold voltage of the selected memory cell MC is close to the verify level VL but data has not been sufficiently written therein. Therefore, in the next write loop, a voltage level of the corresponding bit line BL is set to an intermediate-level voltage Vmid, which is higher than the low-level voltage VSS and lower than the power-supply voltage VDD, (VSS<Vmid<VDD). By using the intermediate-level voltage Vmid, an electric field applied between the floating gate FG and the channel part of the selected memory cell MC is relaxed, so that a shift width of the threshold voltage of the selected memory cell MC becomes relatively small. That is, the memory writes data in the selected memory cell MC relatively weakly.

Selected memory cells MC having threshold voltages equal to or larger than the verify level VL pass verification. Therefore, in subsequent write loops, selection gates SGD of the corresponding columns become non-conductive and no write operation is performed to the selected memory cells MC of the columns.

As described above, in the QPW, when a threshold voltage of a selected memory cell MC is lower than the verify low level VLL, the memory causes a shift width of the threshold voltage of the selected memory cell MC to be relatively large. This increases a write rate and reduces a time period of the write stage. On the other hand, when a threshold voltage of a selected memory cell MC is between the verify low level VLL and the verify level VL, the memory causes a shift width of the threshold voltage of the selected memory cell MC to be relatively small. This enables a threshold distribution width Dp4 of the selected memory cells MC after the write sequence to be smaller than the threshold distribution width Dp3 as shown in FIG. 3D. That is, by using the QPW, the threshold distribution width of the selected memory cells MC after the write sequence can be reduced while prolongation of the time period of the write sequence is suppressed.

However, in the normal QPW, the read operation needs to be performed for each of two different word line voltages (the verify low level VLL and the verify level VL) at each verify read stage. That is, the word line WL needs to be set up (charged) twice in each write loop. To reduce the set-up period for the word line WL, a method of detecting data both of during discharge of sense nodes and after the discharge is proposed. This method requires only one read operation at the verify read stage in each write loop. However, as mentioned above, if data is detected during discharge of the sense nodes, the possibility that the data cannot be correctly detected is increased.

In the memory according to the first embodiment, based on a logic of data detected at the verify read stage in a certain write loop, the data circuit 12 (the sense amplifier S/A) changes a discharge period of the sense nodes at the verify read stage in the next write loop. A configuration and an operation of the memory according to the first embodiment are explained below in more detail.

Figure 4:
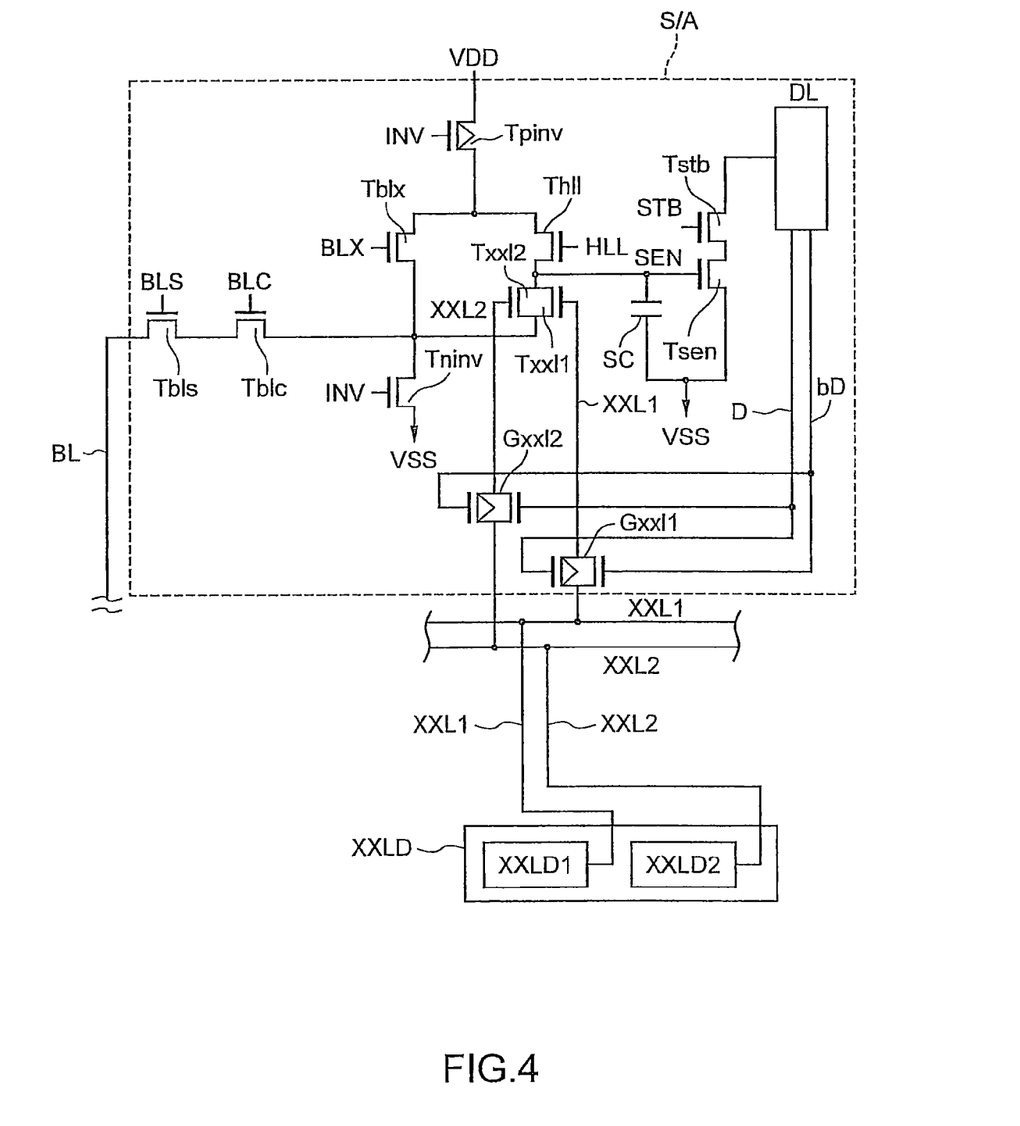
FIG. 4 shows a partial configuration of one of the sense amplifiers S/A of the NAND flash memory according to the first embodiment and peripheral circuits thereof.

FIG. 4 shows a partial configuration of one of the sense amplifiers S/A of the NAND flash memory according to the first embodiment and peripheral circuits thereof. The sense amplifier S/A includes a sense node SEN, an N-type sense transistor Tsen, an N-type strobe transistor Tstb, a sense capacitor SC, a latch circuit DL, an N-type precharge transistor. Thll, N-type discharge transistors Txxl1 and Txxl2, CMOS gates Gxxl1 and Gxxl2, an N-type clamp transistor Tblc, an N-type transistor Tblx, N-type and P-type power-supply transistors Tninv and Tpinv, and an N-type column select transistor Tbls. Most of the transistors constituting the sense amplifier S/A are N-type transistors. For example, the sense transistor Tsen is a transistor of the same conductivity type as that of the transistors Tstb, Thll, Txxl1, and Txxl2 located therearound. Accordingly, plural N-type transistors can be sequentially arranged in a layout. This reduces a layout area of the sense amplifier S/A. Of course, the sense transistors Tsen and the like can be replaced by P-type transistors as long as they can correctly detect data.

At the time of data detection, the sense node SEN transmits a voltage according to data stored in a corresponding selected memory cell MC. A gate of the sense transistor Tsen is connected to the sense node SEN and a conduction state thereof changes according to the voltage of the sense node SEN to cause a current according to the voltage of the sense node SEN to flow. A drain of the sense transistor Tsen is connected to the latch circuit DL via the N-type strobe transistor Tstb. A source of the sense transistor Tsen is connected to the low-level voltage VSS.

The strobe transistor Tstb is controlled by a strobe signal STB and becomes conductive at a timing when the latch circuit DL latches data. Accordingly, the latch circuit DL latches data in the selected memory cell MC based on the conduction state of the sense transistor Tsen.

In the first embodiment, the latch circuit DL latches at least data detected at the verify read stage in a certain write loop (a first write loop) and data detected at the verify read stage in the next write loop (a second write loop). This is to change a verify read condition in the second write loop according to a logic of the data detected in the first write loop.

In a multi-valued memory, the latch circuit DL is usually configured to be able to latch at least three pieces of data. The sense amplifier S/A computes the three pieces of data to determine the state of a threshold voltage of the corresponding selected memory cell MC and change a condition of the write stage. Also in the first embodiment, it suffices to determine the state of a threshold voltage of the selected memory cell MC by computing three data (first to third data mentioned below) and change a condition of the write stage and a condition of the verify read stage based on the determined state.

The sense node SEN is connected to an electrode of the sense capacitor SC, and another electrode of the sense capacitor SC is connected to the low-level voltage VSS. The source of the sense transistor Tsen is also connected to the low-level voltage VSS. The sense capacitor SC is provided to store charge therein during precharge and to release charge therefrom according to a conduction state of the selected memory cell MC during read at the verify read stage, or the like. The voltage of the sense node SEN depends on an amount of charge stored in the sense capacitor SC.

At the verify read stage, the sense node SEN is connected to the power-supply voltage VDD via the N-type precharge transistor Thll and the power-supply transistor Tpinv. The precharge transistor Thll is provided to precharge the sense node SEN upon receiving a precharge signal HLL.

The power-supply transistor Tpinv is provided to connect the power-supply voltage VDD to the sense node SEN or the bit line BL or both upon receiving a signal INV from the latch circuit DL. The power-supply transistor Tninv is provided to connect the low-level voltage VSS to the sense node SEN and/or the bit line BL upon receiving the signal INV.

The sense node SEN is further connected to the bit line BL via the discharge transistors Txxl1 and Txxl2, the clamp transistor Tblc, and the column select transistor Tbls. The discharge transistors Txxl1 and Txxl2 receive signals XXL1 and XXL2, respectively, and either one thereof becomes conductive at the time of data detection. The column select transistor Tbls is provided to connect the sense amplifier S/A and the bit line BL with each other upon receiving a signal BLS. All of the column select transistors Tbls in the same block sharing the signal BLS become conductive at the time of data detection. The clamp transistor Tblc is provided to precharge the bit line BL with a predetermined voltage upon receiving a clamp signal BLC. The transistor Tblx is provided to maintain the voltage of the bit line BL at a constant level during data detection.

The discharge transistors Txxl1 and Txxl2 are connected in parallel between the sense node SEN and the bit line BL and have almost the same characteristics (for example, threshold voltage, channel width, and channel length). The first discharge transistor Txxl1 is provided between the sense node SEN and the selected memory cell MC and operates upon receiving the discharge signal XXL1. The first discharge transistor Txxl1 performs discharge from the sense node SEN through the selected memory cell MC during a first period Ti1 at the time of data detection. The second discharge transistor Txxl2 is provided between the sense node SEN and the selected memory cell MC and operates upon receiving the discharge signal XXL2. The second discharge transistor Txxl2 sets a discharge period of the sense node SEN at the time of data detection to a second period Ti2 longer than the first period Ti1.

The first and second periods Ti1 and Ti2 are previously set by an XXL driver XXLD. The XXL driver XXLD includes an XXL driver XXLD1 that generates a signal XXL1, which is activated to logic high during the first period Ti1, and an XXL driver XXLD2 that generates a signal XXL2, which is activated to logic high during the second period Ti2. The XXL driver XXLD is provided commonly to plural sense amplifiers S/A in the data circuit 12 and is provided, for example, in the data circuit 12 or the controller 20 shown in FIG. 1. The first and second periods Ti1 and Ti2 can be arbitrarily set by a manufacturer or a user.

A discharge period Ticell (Ti1 or Ti2) of the sense node SEN is selected by the CMOS gates Gxxl1 and Gxxl2. The CMOS gate Gxxl1 is provided between the driver XXLD1 and the gate of the discharge transistor Txxl1. The CMOS gate Gxxl1 operates upon receiving period determination signals D and bD according to the data latched by the latch circuit DL. When the CMOS gate Gxxl1 becomes conductive, the signal XXL1 is supplied to the gate of the discharge transistor Txxl1 and the discharge transistor Txxl1 operates.

The CMOS gate Gxxl2 is provided between the driver XXLD2 and the gate of the discharge transistor Txxl2. The CMOS gate Gxxl2 operates upon receiving the period determination signals D and bD according to the data latched by the latch circuit DL. When the CMOS gate Gxxl2 becomes conductive, the signal XXL2 is supplied to the gate of the discharge transistor Txxl2 and the discharge transistor Txxl2 operates.

The period determination signals D and bD are signals that determine the discharge period Ticell (Ti1 or Ti2) of the sense node SEN by selecting either the CMOS gate Gxxl1 or Gxxl2 according to the logic of the data latched by the latch circuit DL. The period determination signal bD is an inversion signal of the period determination signal D.

The CMOS gates Gxxl1 and Gxxl2 operate complementarily to each other. That is, at the time of data detection, either the discharge transistor Txxl1 or Txxl2 selectively operates. Initially, the CMOS gate Gxxl1 is brought into a conductive state and the CMOS gate Gxxl2 is brought into a non-conductive state in the write sequence, for example. This enables the discharge period of the sense node SEN at the verify read stage in each write loop to be set at the first period Ti1. When the selected memory cell MC passes verification in this state, the latch circuit DL inverts a logic of data at that time (first data). The latch circuit DL respectively inverts the period determination signals D and bD according to inversion of the logic of the first data. This brings the CMOS gate Gxxl2 into a conductive state and the CMOS gate Gxxl1 into a non-conductive state. Therefore, the discharge period of the sense node SEN at the verify read stage in each write loop is set to the second period Ti2. The latch circuit DL thereafter holds the logic of the first data until the selected memory cell MC passes verification at the verify read stage using the second period Ti2. When the selected memory cell MC passes verification at the verify read stage using the second period Ti2, the latch circuit DL latches a logic of data at that time (second data). This means that both of the first and second data have been inverted at that time. A write operation is completed at this stage and no data is written in the corresponding selected memory cell MC at the next write stage. Therefore, the sense amplifier S/A can maintain the second period Ti2 without changing the discharge period of the sense node SEN.

The sense amplifier S/A controls the voltage of the bit line BL at the next write stage according to the logic of the first and second data. For example, when both of the first and second data are initially logic low (non-inverted), the sense amplifier S/A connects the low-level voltage VSS to the bit line BL to write data in the selected memory cell MC relatively strongly at the write stage. When the selected memory cell MC passes verification in this state, the first data is inverted to logic high. When the second data is kept logic low and the first data is inverted to logic high, the sense amplifier S/A applies the intermediate-level voltage Vmid to the bit line BL under a control of the clamp signal BLC while connecting the low-level voltage VSS to the bit line BL at the write stage. This causes the sense amplifier S/A to write data in the selected memory cell MC relatively weakly. When the write is completed thereafter, the first and second data are both inverted to logic high. Therefore, at subsequent write stages, the sense amplifier S/A connects the high-level voltage VDD to the bit line BL, and write operations are not conducted on the selected memory cell MC.

The signal INV becomes logic high in columns of memory cells MC for which write has not been completed yet at the write stage and the low-level voltage VSS is connected to the corresponding bit lines BL. In columns of memory cells MC for which write has been completed, the signal INV becomes logic low and the high-level voltage VDD is connected to the corresponding bit lines BL. The signal INV is logic low at the verify read stage.

The latch circuit DL can hold the logic of the first data at the verify read stage using the second period Ti2. Alternatively, the latch circuit DL can compute the first and second data and consequently hold the same logic as the first data. As described above, the sense amplifier S/A according to the first embodiment changes the voltage of the corresponding bit line BL at the write stage according to the first and second data in the latch circuit DL and changes the discharge period of the corresponding sense node SEN at the verify read stage according to the first data in the latch circuit DL.

Because third data latched by the latch circuit DL is Lower data to be used when multi-level data is written and it is not directly relevant to the first embodiment, explanations thereof will be omitted.

An operation of the memory according to the first embodiment is explained next. An operation performed at the write stage in each write loop is basically the same as that according to the QPW explained above with reference to FIGS. 3A to 3D. Therefore, in the first embodiment, a write operation is performed at the write stage by using the low-level voltage VSS and the intermediate-level voltage Vmid as the voltages of the bit lines BL. However, an operation performed at the verify read stage according to the first embodiment is different from the conventional operation according to the QPW, as mentioned below.

Figure 5:
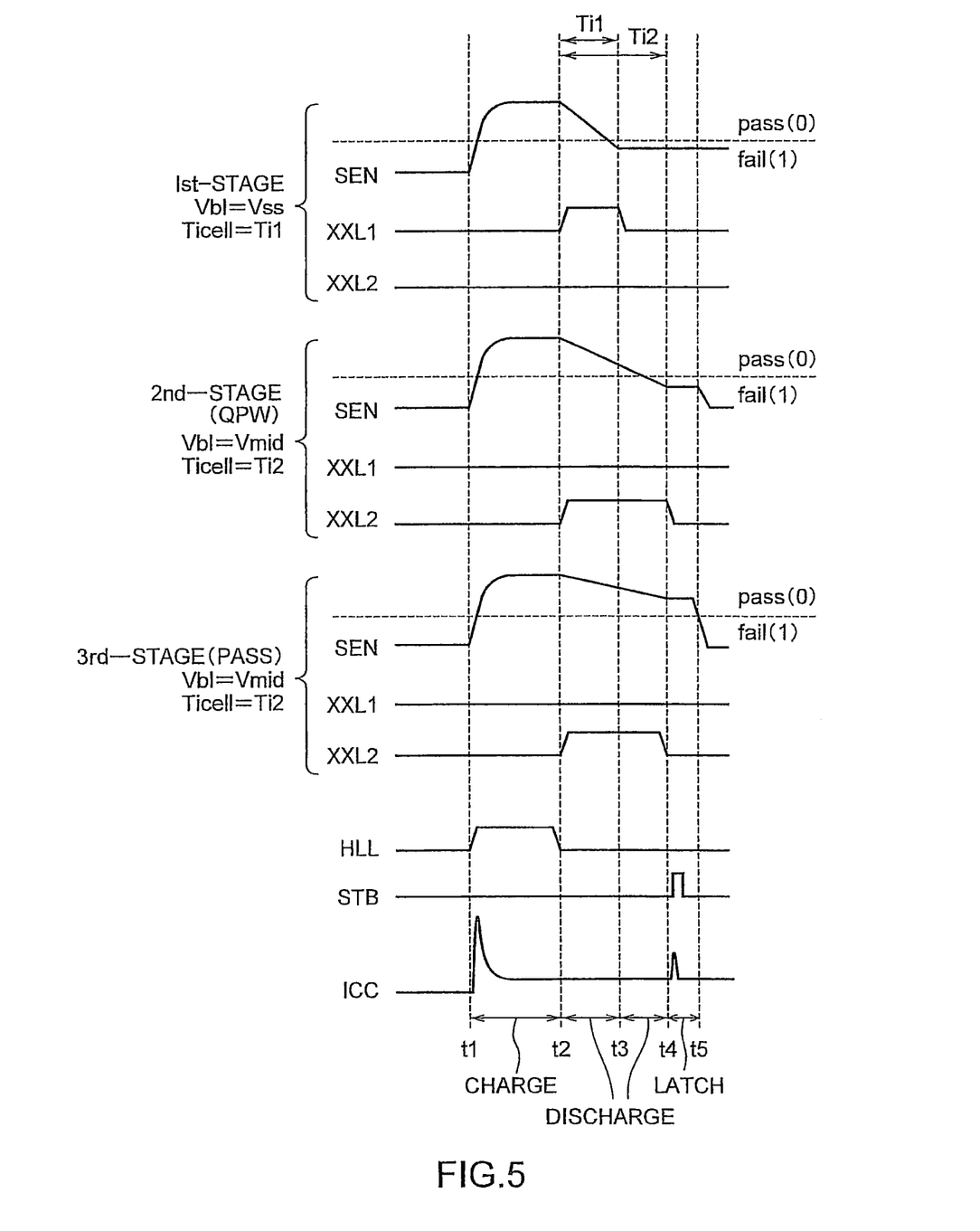
FIG. 5 is a timing chart showing an operation of the memory according to the first embodiment at the verify read stage.

FIG. 5 is a timing chart showing an operation of the memory according to the first embodiment at the verify read stage. The operation will be explained with one write sequence divided into 1st-STAGE to 3rd-STAGE.

[1st-STAGE]

At the write stage in each write loop (a first write loop), the data circuit 12 sets voltage levels Vb1 of bit lines BL to the low-level voltage VSS. Accordingly, shift widths of threshold voltages of the selected memory cells MC at the write stage become relatively large.

Each of the latch circuit DL outputs logic low as the period determination signal D and outputs logic high as the period determination signal bD. This brings the CMOS gate Gxxl1 into a conductive state and the XXL driver XXLD1 brings the first discharge transistor Txxl1 into a conductive state during the first period Ti1. That is, at the verify read stage in each write loop, the corresponding sense amplifiers S/A set the discharge period Ticell of the corresponding sense nodes SEN to the first period Ti1. This facilitates the selected memory cells MC to pass verification.

Between t1 and t2, each of the sense nodes SEN is first precharged via the transistors Tpinv and Thll shown in FIG. 4. The corresponding bit line BL is precharged via the transistors Tpinv, Tblx, Tblc, and Tbls.

At t2, the precharge transistor Thll becomes non-conductive and the first discharge transistor Txxl1 becomes conductive, which starts discharge from the sense node SEN. Accordingly, a current flows from the sense node SEN to the corresponding selected memory cell MC between t2 and t3 (the first period Ti1).

At a 1st-STAGE, between t3 and t4, the sense node SEN keeps a voltage obtained at t3, which is the end of the first period Ti1. Between t4 and t5, the strobe signal STB is activated and the latch circuit DL latches a logic of data stored in the corresponding selected memory cell MC.

When a selected memory cell MC fails verification regardless of the case where the verification can be easily passed, it can be determined that the threshold voltage of the selected memory cell MC is quite lower than the verify level VL. Therefore, the voltage level of the corresponding bit line BL is maintained at the low-level voltage VSS also in the next write loop. Accordingly, the sense amplifier S/A greatly shifts the threshold voltage of the selected memory cell MC at the write stage. Subsequently, the discharge period Ticell of the sense node SEN in the next write loop remains kept at the first period Ti1.

[2nd-STAGE (QPW Stage)]

It can be determined that threshold voltages of selected memory cells MC having passed verification at the 1st-STAGE are close to the verify level VL. Therefore, the voltage levels of the corresponding bit lines BL are set to the intermediate-level voltage Vmid, which is higher than the low-level voltage VSS and lower than the power-supply voltage VDD (VSS<Vmid<VDD), in the next write loop (a second write loop). By using the intermediate-level voltage Vmid, an electric field to be applied between the floating gate FG and the channel part of each selected memory cell MC is relaxed and a shift width of the threshold voltage of each selected memory cell MC becomes relatively small. That is, the memory writes data in the selected memory cells MC relatively weakly.

When verification is passed at the 1st-STAGE, the first data in each of the corresponding latch circuits DL is inverted. The latch circuit DL inverts a logic of the period determination signals D and bD according to inversion of the first data. That is, the latch circuit DL outputs logic high as the period determination signal D and outputs logic low as the period determination signal bD. This brings the CMOS gate Gxxl2 into a conductive state and the XXL driver XXLD2 brings the second discharge transistor Txxl2 into a conductive state only during the second period Ti2. That is, the corresponding sense amplifiers S/A change the discharge period Ticell of the corresponding sense nodes SEN to the second period Ti2 at the verify read stage in the next write loop. Accordingly, the corresponding selected memory cells MC are in a situation where verification is less easily passed.

A precharge operation performed between t1 and t2 at a 2nd-STAGE is the same as that performed between t1 and t2 at the 1st-STAGE.

At t2, the precharge transistor Thll becomes non-conductive and the discharge transistor Txxl2 becomes conductive. This causes a current to flow from the sense node SEN to the selected memory cell MC between t2 and t4 (the second period Ti2).

Between t4 and t5, the strobe signal STB is activated and the latch circuit DL latches a logic of data stored in the selected memory cell MC.

When a selected memory cell MC fails verification, it can be determined that the threshold voltage of the selected memory cell MC is close to the verify level VL but has not yet reached the verify level VL. Therefore, the voltage of the corresponding bit line BL is maintained at the intermediate-level voltage Vmid in the next write loop. Accordingly, the sense amplifier S/A causes a relatively small shift of the threshold voltage of the selected memory cell MC at the write stage. The period Ticell of the sense node SEN in the next write loop is continuously maintained at the second period Ti2.

[3rd-STAGE (Write Complete Stage)]

It can be determined that threshold voltages of selected memory cells MC having passed verification have reached the verify level VL (write has been completed) at the 2nd-STAGE. At this time, the second data latched by the latch circuit DL is inverted. Inversion of the second data in the latch circuit DL indicates that both of the first and second data have been inverted. Therefore, the power-supply voltage VDD is connected to the bit lines BL and thus no write is performed in the corresponding selected memory cells MC in subsequent write loops. In this case, it suffices that the period determination signals D and bD hold the same states as those at the 2nd-STAGE according to the first data.

As described above, according to the first embodiment, the shift width of the threshold voltage can be changed at the write stage in each write loop according to the threshold voltage of the selected memory cell MC as in the QPW. For example, it may be said that the 1st-STAGE corresponds to the verify read operation using the verify low level VLL in the QPW. The 2nd-STAGE corresponds to the verify read operation using the verify level VL in the QPW. The 3rd-STAGE corresponds to the write complete state in the QPW. In this way, the width of the threshold voltage distribution of the selected memory cells MC after the write sequence can be narrowed as in the QPW. The narrowed width of the threshold voltage distribution is advantageous to multi-level cells (MLC).

Each of the sense amplifiers S/A requires only one data detection operation at the verify read stage in each write loop. That is, as shown in FIG. 5, it suffices that the strobe signal STB is activated only once and that the latch circuit DL latches data only once at each verify read stage. Therefore, the set-up time of the word line WL can be reduced and the period of the verify read stage in each write loop can be reduced. Because the write sequence includes plural write loops, reduction in the period of the verify read stage in each write loop leads to great reduction in the period of the entire write sequence.

Further, at the verify read stage in each write loop, the sense amplifiers S/A do not perform a data latch operation during the period of discharge from the corresponding sense nodes SEN (the first period Ti1 or the second period Ti2) but perform a data latch operation after the end of the discharge period. That is, at each verify read stage, the strobe signal STB is not activated during the discharge period (between t2 and t3 or between t2 and t4) but is activated after the end of the discharge period, as shown in FIG. 5. Therefore, the conduction state of the sense transistor Tsen never changes during data detection, and thus, the latch circuit DL can latch data with high accuracy.

Referring to a consumption current Icc shown in FIG. 5, it is clearly understood that the strobe signal STB is activated only once after the end of the discharge period of the sense nodes SEN. The consumption current Icc is a current consumed in an entire memory chip. The consumption current Icc temporarily increases at a precharge time t1 of the bit lines BL and the sense nodes SEN and then decreases to a cell current flowing through the selected memory cells MC. Because a current flows in the sense transistors Tsen at the time of activation of the strobe signal STB, the consumption current Icc has a peak at t4. In this way, the consumption current Icc has only one peak after precharge in the first embodiment. Accordingly, the memory according to the first embodiment can be clearly distinguished from a memory which performs a data detect operation or a latch operation plural times during each verify read.

Second Embodiment

In a memory according to a second embodiment, based on a logic of data detected at the verify read stage in a certain write loop, the data circuit 12 (the sense amplifiers S/A) changes initial voltages (precharge voltages) of the corresponding sense nodes SEN before discharge from the sense nodes SEN to the corresponding selected memory cells MC at the verify read stage in the next write loop. A configuration and an operation of the memory according to the second embodiment are explained below in more detail.

Figure 6:
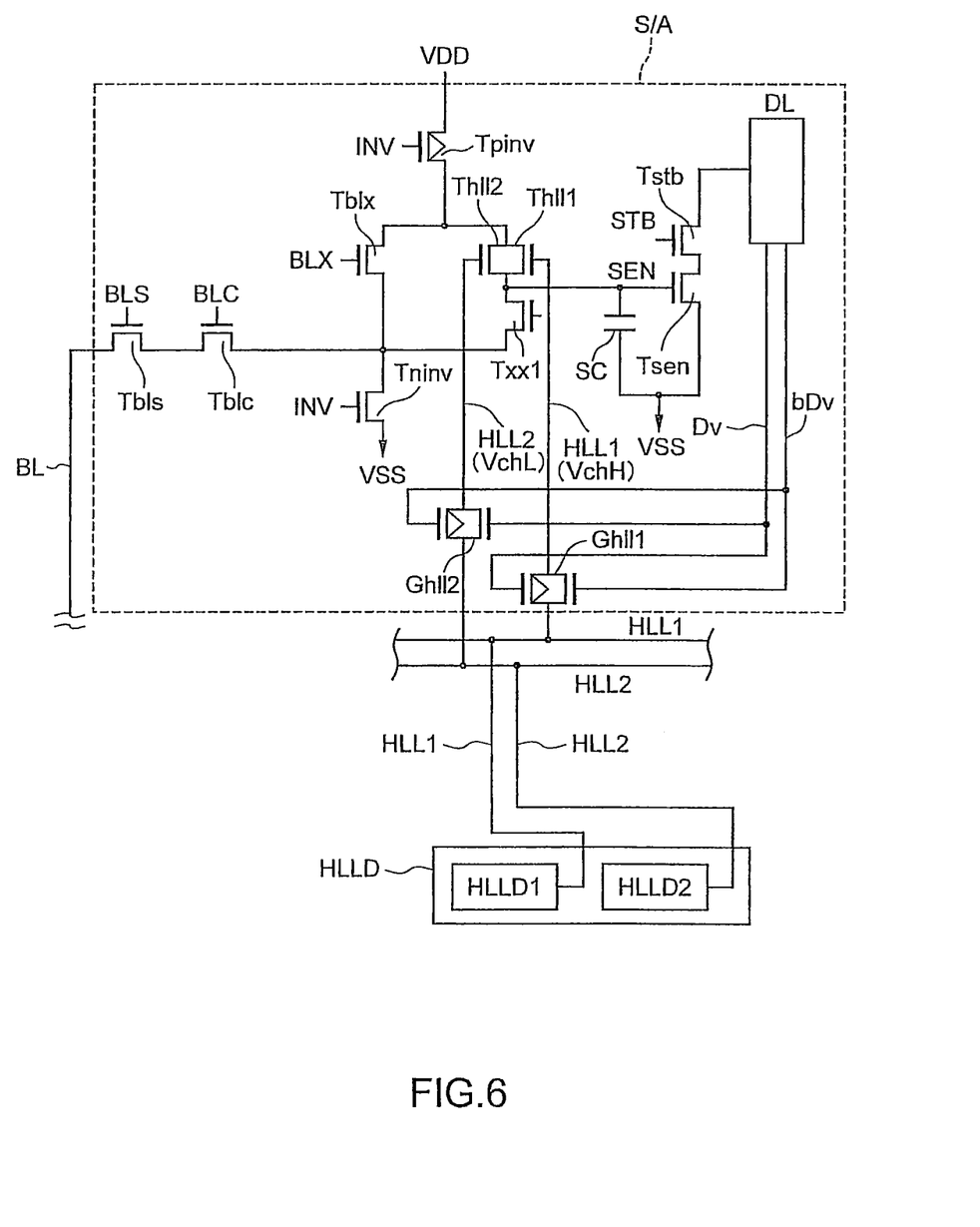
FIG. 6 shows a partial configuration of one of sense amplifiers S/A in a NAND flash memory according to the second embodiment and peripheral circuits thereof.

FIG. 6 shows a partial configuration of one of sense amplifiers S/A in a NAND flash memory according to the second embodiment and peripheral circuits thereof. The sense amplifier S/A according to the second embodiment is different from that according to the first embodiment in including two precharge transistors Thll1 and Thll2 and one discharge transistor Txxl.

The precharge transistors Thll1 and Thll2 receive signals HLL1 and HLL2, respectively, and either one thereof becomes conductive at the time of precharge to charge the corresponding sense node SEN. The precharge transistors Thll1 and Thll2 are connected in parallel between the power-supply voltage VDD and the sense node SEN and have almost the same characteristics (for example, threshold voltage, channel width, and channel length). The first precharge transistor Thll1 sets the sense node SEN to a first initial voltage Vhll1 at the time of precharge before discharge from the sense node SEN. The second precharge transistor Thll2 sets the sense node SEN to a second initial voltage Vhll2 lower than the first initial voltage Vhll1 in the absolute value at the time of precharge.

The first and second initial voltages Vhll1 and Vhll2 depend on first and second gate voltages VchH and VchL that control the precharge transistors Thll1 and Thll2, respectively. An HLL driver HLLD includes an HLL driver HLLD1 that generates the first gate voltage VchH (a gate signal HLL1) for setting the sense node SEN to the first initial voltage Vhll1, and an HLL driver HLLD2 that generates the second gate voltage VchL (a gate signal HHL2) for setting the sense node SEN to the second initial voltage Vhll2. The second gate voltage VchL is lower than the first gate voltage VchH in the absolute value.

The HLL driver HLLD is provided commonly to plural sense amplifiers S/A in the data circuit 12 and is provided, for example, in the data circuit 12 or the controller 20 shown in FIG. 1. The first and second gate voltages VchH and VchL can be arbitrarily set by a manufacturer or a user.

Either the first gate voltage VchH or the second gate voltage VchL is selected by a CMOS gate Ghll1 or Ghll2. The CMOS gate Ghll1 is provided between the HLL driver HLLD1 and the gate of the precharge transistor Thll1. The CMOS gate Ghll1 operates upon receiving voltage determination signals Dv and bDv from the latch circuit DL. When the CMOS gate Ghll1 becomes conductive, the first gate voltage VchH is supplied to the gate of the precharge transistor Thll1, and thus, the precharge transistor Thll1 operates. The CMOS gate Ghll2 is provided between the HLL driver HLLD2 and the gate of the precharge transistor Thll2. The CMOS gate Ghll2 operates upon receiving the voltage determination signals Dv and bDv from the latch circuit DL. When the CMOS gate Ghll2 becomes conductive, the second gate voltage VchL lower than the first gate voltage VchH in the absolute value is supplied to the gate of the precharge transistor Thll2, and thus, the precharge transistor Thll2 operates. The voltage determination signal bDv is an inversion signal of the voltage determination signal Dv.

The CMOS gates Ghll1 and Ghll2 operate complementarily to each other. That is, either the precharge transistor Thll1 or Thll2 selectively operates at the time of precharge. For example, initially in the write sequence, the CMOS gate Ghll1 is brought into a conductive state and the CMOS gate Ghll2 is brought into a non-conductive state. This sets the precharge voltage of the sense node SEN to the first initial voltage Vhll1 at the verify read stage in each write loop. When the selected memory cell MC passes verification in this state, the latch circuit DL latches a logic of data (first data) at that time. The latch circuit DL respectively inverts the voltage determination signals Dv and bDv according to inversion of a logic of the first data. Accordingly, the CMOS gate Ghll2 becomes conductive and the CMOS gate Ghll1 becomes non-conductive. Therefore, the precharge voltage of the sense node SEN at the verify read stage in each write loop is set to the second initial voltage Vhll2. Thereafter, the latch circuit DL holds the logic of the first data until the selected memory cell MC passes verification at the verify read stage using the second initial voltage Vhll2. When the selected memory cell MC passes the verification at the verify read state using the second initial voltage Vhll2, the latch circuit DL latches a logic of data (second data) at that time. This indicates that both of the first and second data have been inverted at that time. The latch circuit DL sets the signal INV to logic low according to inversion of both of the first and second data. This completes write of the corresponding column. No data is written in the selected memory cell MC of the corresponding column in subsequent write loops.

Other configurations of the sense amplifier S/A shown in FIG. 6 can be the same as those of the sense amplifier S/A shown in FIG. 4. A configuration of the latch circuit DL according to the second embodiment can be the same as that of the latch circuit DL according to the first embodiment.

Figure 7:
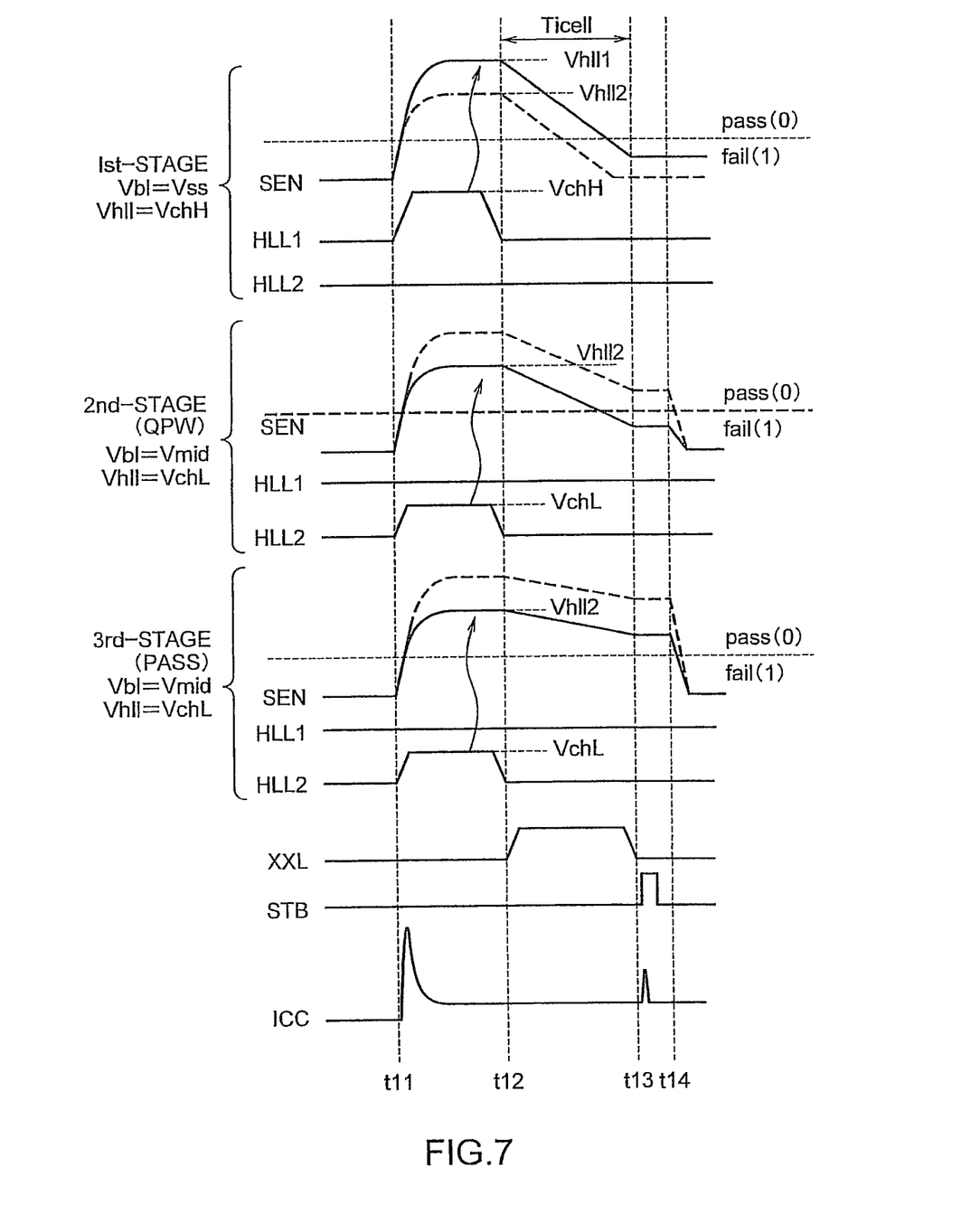
FIG. 7 is a timing chart showing an operation of the memory according to the second embodiment at the verify read stage.

FIG. 7 is a timing chart showing an operation of the memory according to the second embodiment at the verify read stage. The operation is explained with one write sequence divided into 1st-STAGE to 3rd-STAGE.

[1st-STAGE]

At the write stage in each write loop (a first write loop), the data circuit 12 sets voltage levels Vb1 of bit lines BL to the low-level voltage VSS. This makes a shift width of the threshold voltage of each selected memory cell MC at the write stage to be relatively large.

The latch circuit DL outputs logic low as the voltage determination signal Dv and logic high as the voltage determination signal bDv. This brings the CMOS gate Ghll1 into a conductive state and the HLL driver HLLD1 applies the first gate voltage VchH to the gate of the first precharge transistor Thll1 at the verify read stage. That is, the corresponding sense node SEN is precharged with the first initial voltage Vhll1 higher than the second initial voltage Vhll2. As can be understood by comparing broken lines with solid lines in FIG. 7, when a precharge voltage of the sense node SEN is high, the selected memory cell MC more easily passes verification if the same discharge from the sense node SEN to the selected memory cell MC is performed.

Between t11 and t12, the sense node SEN is initially precharged with the first initial voltage Vhll1 via the power-supply transistor Tpinv and the first precharge transistor Thll1 shown in FIG. 6. The corresponding bit line BL is precharged via the transistors Tpinv, Tblx, Tblc, and Tbls.

At t12, the first precharge transistor Thll1 becomes non-conductive and the discharge transistor Txxl becomes conductive, which starts discharge from the sense node SEN. Accordingly, charge is released from the sense node SEN to the corresponding selected memory cell MC between t12 and t13. In the second embodiment, a discharge period of the sense node SEN is set to a predetermined period Ticell.

Between t13 and t14, the strobe signal STB is activated and the latch circuit DL latches a logic of data stored in the selected memory cell MC.

Because the sense node SEN is precharged with the relatively-high first initial voltage Vhll1, the selected memory cell MC is in a state in which it can easily pass verification.

When the selected memory cell MC fails the verification regardless of this state, it can be determined that the threshold voltage of the selected memory cell MC is quite lower than the verify level VL. Therefore, the voltage level of the corresponding bit line BL is maintained at the low-level voltage VSS in the next write loop. Accordingly, the sense amplifier S/A greatly shifts the threshold voltage of the selected memory cell MC at the write stage. The sense node SEN is continuously precharged with the first initial voltage Vhll1 in the next write loop.

[2nd-STAGE (QPW stage)]

It can be determined that threshold voltages of selected memory cells MC having passed verification at the 1st-STAGE are close to the verify level VL. Therefore, the voltage levels of the corresponding bit lines BL are set to the intermediate-level voltage Vmid, which is higher than the low-level voltage VSS and lower than the power-supply voltage VDD (VSS<Vmid<VDD), in the next write loop (a second write loop). By using the intermediate-level voltage Vmid, an electric field to be applied between the floating gate FG and the channel part of each selected memory cell MC is relaxed and a shift width of the threshold voltage of each selected memory cell MC becomes relatively small. That is, the memory writes data in the selected memory cells MC relatively weakly.

When the verification is passed at the 1st-STAGE, the first data in each of the corresponding latch circuits DL is inverted. The latch circuit DL inverts a logic of the voltage determination signals Dv and bDv according to inversion of the first data. That is, the latch circuit DL outputs logic high as the voltage determination signal Dv and logic low as the voltage determination signal bDv. This brings the CMOS gate Ghll2 into a conductive state and the HLL driver HLLD2 applies the second gate voltage VchL to the gate of the second precharge transistor Thll2 at the verify read stage. That is, the corresponding sense nodes SEN are precharged with the second initial voltage Vhll2 lower than the first initial voltage Vhll1 in the absolute value at the verify read stage in the next write loop. This makes the selected memory cells MC to be in a state in which verification is relatively not easily passed.

In a precharge operation between t11 and t12 at the 2nd-STAGE, each of the sense nodes SEN is precharged with the second initial voltage Vhll2 via the power-supply transistor Tpinv and the second precharge transistor Thll2 shown in FIG. 6. A precharge operation for the bit lines BL is the same as that performed at the 1st-STAGE.

At t12, the second precharge transistor Thll2 becomes non-conductive and the discharge transistor Txxl becomes conductive. This causes charge to be released from the sense node SEN to the selected memory cell MC between t12 and t13. The discharge period of the sense node SEN is the predetermined period Ticell.

Between t13 and t14, the strobe signal STB is activated and the latch circuit DL latches a logic of data stored in the selected memory cell MC.

Because the sense node SEN is precharged with the second initial voltage Vhll2 lower than the first initial voltage Vhll1 in the absolute value, the selected memory cell MC is in a state in which verification is less easily passed than that at the 1st-STAGE. Therefore, when the selected memory cell MC fails the verification, it can be determined that the threshold voltage of the selected memory cell MC is close to the verify level VL but has not yet reached the verify level VL. Accordingly, in the next write loop, the voltage level of the corresponding bit line BL is maintained at the intermediate-level voltage Vmid. This causes a relatively small shift of the threshold voltage of the selected memory cell MC at the write stage. The sense node SEN is continuously precharged with the second initial voltage Vhll2 in the next write loop.

[3rd-STAGE (Write Complete Stage)]

It can be determined that threshold voltages of selected memory cells MC having passed verification have reached the verify level VL (write has been completed) at the 2nd-STAGE. At that time, the second data latched by the latch circuit DL is inverted. An operation of the latch circuit DL at that time can be the same as that of the latch circuit DL at the 3rd-STAGE according to the first embodiment.

As described above, according to the second embodiment, the shift width of the threshold voltage can be changed at the write stage in each write loop as in the QPW, although the change of the shift width is based on the precharge voltage of the sense node SEN. For example, it may be said that the 1st-STAGE corresponds to the verify read operation using the verify low level VLL in the QPW. The 2nd-STAGE corresponds to the verify read operation using the verify level VL in the QPW. The 3rd-STAGE corresponds to the write complete state in the QPW. Accordingly, the second embodiment can also achieve effects identical to those of the first embodiment.

According to the second embodiment, each of the sense amplifiers S/A requires only one data detect operation at the verify read stage in each write loop. Furthermore, at the verify read stage in each write loop, the sense amplifiers S/A perform a data latch operation after the end of the period of discharge from the corresponding sense nodes SEN without performing the data latch operation during the discharge period. Therefore, the second embodiment can also achieve effects identical to those of the first embodiment.

According to the second embodiment, with reference to a consumption current Icc shown in FIG. 7, it is clearly understood that the strobe signal STB is activated only once after the end of the discharge of the sense nodes SEN. Therefore, the memory according to the second embodiment can be clearly distinguished from a memory which performs the data detect operation or the latch operation plural times during each verify read.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of memory cells; and
a sense amplifier including a sense node that transmits a voltage according to a current flowing in a corresponding one of the memory cells and configured to detect a logic of data based on the voltage of the sense node, wherein
a write sequence of writing data in a selected memory cell among the memory cells is performed by repeating write loops each including a write stage of writing data in the selected memory cell and a verify read stage of verifying that the data has been written in the selected memory cell by performing discharge from the sense node through the selected memory cell, and
the sense amplifier changes, according to a logic of data detected at the verify read stage in a first write loop among the write loops, a period of discharge from the sense node to the selected memory cell at the verify read stage in a second write loop following the first write loop.

2. The device of claim 1, wherein
the sense amplifier performs discharge from the sense node through the selected memory cell during a first period at the verify read stage of the first write loop, and
the sense amplifier performs discharge from the sense node through the selected memory cell during a second period longer than the first period at the verify read stage of the second write loop.

3. The device of claim 1, wherein
the sense amplifier comprises:
a first discharge transistor provided between the sense node and the selected memory cell and configured to perform discharge from the sense node through the selected memory cell during a first period; and
a second discharge transistor provided between the sense node and the selected memory cell and configured to perform discharge from the sense node through the selected memory cell during a second period longer than the first period, wherein
the sense amplifier performs discharge from the sense node by using the first discharge transistor at the verify read stage in the first write loop, and
the sense amplifier performs discharge from the sense node by using the second discharge transistor at the verify read stage in the second write loop.

4. The device of claim 2, wherein
the sense amplifier comprises:
a first discharge transistor provided between the sense node and the selected memory cell and configured to perform discharge from the sense node through the selected memory cell during a first period; and
a second discharge transistor provided between the sense node and the selected memory cell and configured to perform discharge from the sense node through the selected memory cell during a second period longer than the first period, wherein
the sense amplifier performs discharge from the sense node by using the first discharge transistor at the verify read stage in the first write loop, and
the sense amplifier performs discharge from the sense node by using the second discharge transistor at the verify read stage in the second write loop.

5. The device of claim 3, wherein the first and second discharge transistors are connected in parallel to each other and have almost same characteristics.

6. The device of claim 4, wherein the first and second discharge transistors are connected in parallel to each other and have almost same characteristics.

7. The device of claim 1, wherein the sense amplifier further comprises a latch circuit configured to latch a logic of data detected at the verify read stage in the first write loop and to output a period determination signal for determining a discharge period of discharge from the sense node to the selected memory cell at the verify read stage in the second write loop according to the logic of the data.

8. The device of claim 1, wherein the sense amplifier detects data only once after performing discharge from the sense node through the selected memory cell at each verify read stage in the first and second write loops.

9. A semiconductor storage device comprising:
a plurality of memory cells; and
a sense amplifier including a sense node that transmits a voltage according to a current flowing in a corresponding one of the memory cells and configured to detect a logic of data based on the voltage of the sense node, wherein a write sequence of writing data in a selected memory cell among the memory cells is performed by repeating write loops each including a write stage of writing data in the selected memory cell and a verify read stage of verifying that the data has been written in the selected memory cell by performing discharge from the sense node through the selected memory cell, and the sense amplifier changes, according to a logic of data detected at the verify read stage in a first write loop among the write loops, an initial voltage of the sense node before discharge from the sense node at the verify read stage in a second write loop following the first write loop.

10. The device of claim 9, wherein the sense amplifier sets the sense node to a first initial voltage before discharge from the sense node at the verify read stage of the first write loop, and the sense amplifier sets the sense node to a second initial voltage lower than the first initial voltage in the absolute value before discharge from the sense node at the verify read stage of the second write loop.

11. The device of claim 9, wherein the sense amplifier comprises:

a first precharge transistor provided between a power supply and the sense node and configured to set the sense node to a first initial voltage; and a second precharge transistor provided between the power supply and the sense node and configured to set the sense node to a second initial voltage lower than the first initial voltage in the absolute value, wherein the sense amplifier sets an initial voltage of the sense node by using the first precharge transistor at the verify read stage in the first write loop, and the sense amplifier sets an initial voltage of the sense node by using the second precharge transistor at the verify read stage in the second write loop.

12. The device of claim 10, wherein the sense amplifier comprises:

a first precharge transistor provided between a power supply and the sense node and configured to set the sense node to a first initial voltage; and a second precharge transistor provided between the power supply and the sense node and configured to set the sense node to a second initial voltage lower than the first initial voltage in the absolute value, wherein the sense amplifier sets an initial voltage of the sense node by using the first precharge transistor at the verify read stage in the first write loop, and the sense amplifier sets an initial voltage of the sense node by using the second precharge transistor at the verify read stage in the second write loop.

13. The device of claim 11, wherein the first precharge transistor is driven at a first gate voltage, and the second precharge transistor is driven at a second gate voltage lower than the first gate voltage in the absolute value.

14. The device of claim 12, wherein the first precharge transistor is driven at a first gate voltage, and the second precharge transistor is driven at a second gate voltage lower than the first gate voltage in the absolute value.

15. The device of claim 11, wherein the first and second precharge transistors are connected in parallel to each other and have almost same characteristics.

16. The device of claim 12, wherein the first and second precharge transistors are connected in parallel to each other and have almost same characteristics.

17. The device of claim 9, wherein the sense amplifier further comprises a latch circuit configured to latch a logic of data detected at the verify read stage in the first write loop and to output a voltage determination signal for determining an initial voltage of the sense node at the verify read stage in the second write loop according to the logic of the data.

18. The device of claim 9, wherein the sense amplifier detects data only once after performing discharge from the sense node through the selected memory cell at each verify read stage in the first and second write loops.

* * * * *